(12) United States Patent
Andersen et al.

(10) Patent No.: US 10,236,810 B2
(45) Date of Patent: Mar. 19, 2019

(54) MONITORING OF A DC-LINK OF A SPLIT WIND-TURBINE-CONVERTER SYSTEM

(71) Applicant: VESTAS WIND SYSTEMS A/S, Aarhus N (DK)

(72) Inventors: Søren Andersen, Tilst (DK); John Godsk Nielsen, Hornslet (DK); Duy Duc Doan, Tilst (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 0 days.

(21) Appl. No.: 15/543,322

(22) PCT Filed: Jan. 6, 2016

(86) PCT No.: PCT/DK2016/050002
§ 371 (c)(1),
(2) Date: Jul. 13, 2017

(87) PCT Pub. No.: WO2016/112915
PCT Pub. Date: Jul. 21, 2016

(65) Prior Publication Data
US 2017/0373625 A1 Dec. 28, 2017

(30) Foreign Application Priority Data

Jan. 13, 2015 (DK) .................. 2015 70012

(51) Int. Cl.
*F03D 7/02* (2006.01)
*H02J 3/36* (2006.01)
(Continued)

(52) U.S. Cl.
CPC ............ *H02P 9/006* (2013.01); *F03D 7/0264* (2013.01); *F03D 7/0284* (2013.01); *F03D 7/04* (2013.01);
(Continued)

(58) Field of Classification Search
USPC .................... 290/44, 55; 307/42, 82
See application file for complete search history.

(56) References Cited

U.S. PATENT DOCUMENTS 7,332,827 B2 * 2/2008 Nielsen .................. H02P 9/006
290/55
8,766,480 B2 * 7/2014 Hiller ..................... H02M 7/49
307/82

(Continued)

FOREIGN PATENT DOCUMENTS

CN    103078349 A    5/2013
EP    2461026 A1    6/2012
(Continued)

OTHER PUBLICATIONS

Knop, A. et al: "High frequency grid impedance analysis with three-phase converter and FPGA based tolerance band controller", Compatibility and Power Electronics, 2009, CPE '09, IEEE, Piscataway, NJ, USA, May 20, 2009, pp. 286-291.
(Continued)

*Primary Examiner* — Pedro J Cuevas
(74) *Attorney, Agent, or Firm* — Patterson + Sheridan, LLP

(57) ABSTRACT

A method of monitoring a split wind-turbine-converter system with at least one generator-side converter and at least one grid-side converter arranged at distant locations, and a DC-link in the form of an elongated conductor arrangement with at least one positive and at least one negative conductor. The impedance of the DC-link conductor arrangement is determined by means of DC-voltage sensors. The voltages between the positive and the negative conductors are determined at the generator-side converter and at the grid-side converter, and the difference between the voltages is determined. The impedance of the DC-link conductor arrangement is determined by putting the determined voltage dif-
(Continued)

ference in relation to the DC current flowing through the DC-link conductor arrangement. If the impedance exceeds a given impedance threshold a fault state is recognized.

15 Claims, 10 Drawing Sheets

(51) Int. Cl.
| | | |
|---|---|---|
| *H02P 9/00* | (2006.01) | |
| *F03D 7/04* | (2006.01) | |
| *F03D 9/25* | (2016.01) | |
| *H02J 3/38* | (2006.01) | |
| *H02K 7/18* | (2006.01) | |
| *G01R 27/16* | (2006.01) | |
| *G01R 31/34* | (2006.01) | |
| *G01R 31/42* | (2006.01) | |
| *H02M 5/458* | (2006.01) | |
| *G01R 31/40* | (2014.01) | |
| *H02P 101/15* | (2016.01) | |

(52) U.S. Cl.
CPC .............. *F03D 9/255* (2017.02); *G01R 27/16* (2013.01); *G01R 31/343* (2013.01); *G01R 31/42* (2013.01); *H02J 3/36* (2013.01); *H02J 3/386* (2013.01); *H02K 7/1838* (2013.01); *H02M 5/4585* (2013.01); *G01R 31/40* (2013.01); *H02P 2101/15* (2015.01); *H02P 2201/03* (2013.01); *Y02E 10/723* (2013.01); *Y02E 10/763* (2013.01); *Y02E 60/60* (2013.01)

(56) References Cited

U.S. PATENT DOCUMENTS

| | | | | |
|---|---|---|---|---|
| 9,048,691 | B2* | 6/2015 | Crane | H02J 3/36 |
| 9,291,152 | B2* | 3/2016 | Gupta | F03D 7/0284 |
| 9,362,751 | B2* | 6/2016 | Jensen | H02J 3/36 |
| 9,702,908 | B2* | 7/2017 | Gupta | G01R 19/16533 |
| 10,061,957 | B2* | 8/2018 | Yoscovich | G06F 17/11 |
| 2006/0238929 | A1* | 10/2006 | Nielsen | H02P 9/006 361/20 |
| 2008/0252142 | A1* | 10/2008 | Davies | H02J 3/1864 307/42 |
| 2010/0109328 | A1 | 5/2010 | Li et al. | |
| 2011/0049994 | A1 | 3/2011 | Hiller et al. | |
| 2012/0300510 | A1* | 11/2012 | Jensen | H02J 3/36 363/35 |
| 2013/0128630 | A1* | 5/2013 | Jensen | H02J 3/36 363/35 |
| 2013/0138257 | A1 | 5/2013 | Edenfeld | |
| 2013/0182465 | A1 | 7/2013 | Wang et al. | |
| 2013/0264824 | A1* | 10/2013 | Gupta | F03D 7/0284 290/44 |
| 2014/0268926 | A1 | 9/2014 | Gupta et al. | |
| 2016/0059711 | A1* | 3/2016 | Holmes | H02P 5/74 318/51 |
| 2016/0231365 | A1* | 8/2016 | Gupta | F03D 7/0284 |
| 2016/0241153 | A1* | 8/2016 | Abeyasekera | H02M 7/493 |
| 2016/0359326 | A1* | 12/2016 | Sun | H02J 3/1878 |
| 2018/0294712 | A1* | 10/2018 | Kaufman | H02M 1/32 |

FOREIGN PATENT DOCUMENTS

| | | |
|---|---|---|
| EP | 2528184 A1 | 11/2012 |
| JP | 2000047741 A | 2/2000 |

OTHER PUBLICATIONS

Sumner, M. et al: "Intelligent protection for embedded generation using active impedance estimation", Power Electronics for Distributed Generation Systems (PEDG), 2010 2nd IEEE International Symposium on, IEEE, Piscataway, NJ, USA, Jun. 16, 2010, pp. 47-52.
International Search Report for PCT/DK2016/050002, dated Apr. 25, 2016.
Danish Search Report for PA 2015 70012, dated Aug. 27, 2015.

* cited by examiner

MONITORING OF A DC-LINK OF A SPLIT WIND-TURBINE-CONVERTER SYSTEM

FIELD OF THE INVENTION

The invention relates to the field of wind turbines and, for example, to a method of monitoring a split wind-turbine-converter system with a DC-link and to a split wind-turbine-converter system.

BACKGROUND

US 2013/0138257 A1 describes a protection and control system for an electric power system of a wind turbine with short circuit detection upstream of the transformer. A memory device stores a plurality of voltage measurements and a processor determines an approximate location of the electrical fault as a function of the measured voltage change.

SUMMARY OF THE INVENTION

A method is provided of monitoring a split wind-turbine-converter system with at least one generator-side converter, at least one grid-side converter, and a DC-link. The DC-link connects the at least one generator-side converter to the at least one grid-side converter. The at least one generator-side converter and the at least one grid-side converter are arranged at distant locations. The DC-link is provided by an elongated conductor arrangement and comprises at least one positive conductor and at least one negative conductor. The method comprises determining an impedance of the elongated DC-link conductor arrangement by means of first and second DC-voltage sensors that measure voltage. To do this the first DC-voltage sensor determines the voltage between the positive and the negative conductor of the DC-link conductor arrangement at the generator-side converter; the second DC-voltage sensor determines the voltage between the positive and the negative conductor of the DC-link conductor arrangement at the grid-side converter; a difference between the voltages is determined on the basis of the first and second DC-voltage sensors; the impedance of the DC-link conductor arrangement is determined by putting the determined voltage difference in relation to a known or measured current flowing through the DC-link conductor arrangement.

A fault state is recognized in response to the impedance exceeding a given impedance threshold.

According to another aspect a split wind-turbine-converter system with at least one generator-side converter, at least one grid-side converter, a DC-link, and a controller is provided. The at least one generator-side converter and the at least one grid-side converter are arranged at distant locations. The DC-link connects the at least one generator-side converter to the at least one grid-side converter. The DC-link is provided by an elongated conductor arrangement comprising at least one positive conductor and at least one negative conductor. The controller is arranged to determine a voltage between the positive and the negative conductor of the DC-link conductor arrangement at the generator-side converter using a first DC-voltage sensor that measures voltage. The controller is further arranged to determine a voltage between the positive and the negative conductor of the DC-link conductor arrangement at the grid-side converter using a second DC-voltage sensor that measures voltage. The controller is arranged to determine a difference between the voltages determined on the basis of the first and second DC-voltage sensor. The controller is also arranged to determine an impedance of the DC-link conductor arrangement by putting the voltage difference in relation to a known or measured current flowing through the DC-link conductor arrangement. The controller is arranged to recognize a fault state in response to the impedance exceeding a given impedance threshold.

GENERAL DESCRIPTION, ALSO OF OPTIONAL EMBODIMENTS, OF THE INVENTION

In some embodiments, the wind-turbine-converter system is arranged to convert variable-frequency electrical power produced by a variable-speed wind turbine into fixed-frequency electrical power to be fed into an electrical grid.

For example, the converter system of a variable speed wind-turbine converts three-phase AC power with a variable frequency, produced by a wind-turbine generator depending on wind speed, to AC power of a fixed-frequency, e.g. 50 Hz or 60 Hz, to be fed into the electrical grid. The variable frequency AC current is first converted to DC current by the converter system and then this DC current is converted to the AC current corresponding to the fixed-frequency electrical power.

The method disclosed is for monitoring a split wind-turbine-converter system with at least one generator-side converter, at least one grid-side converter, and a DC-link. In embodiments with a plurality of generator-side converters and grid-side converters connected in series and/or in parallel, the DC-link is common for all the generator-side and grid-side converters. The generator-side converter(s), for example, turn a three-phase AC current received from the wind turbine generator into DC current by rectifying the individual phases. In some embodiments each generator-side converter is connected to an individual set of generator windings.

The grid-side converter(s), for example, turn the DC current back into a three-phase AC current by inverting the DC current, e.g. by using insulated-gate bipolar transistors (IGBTs). The AC current may be supplied to a transformer to produce high voltage, which can then be fed into the electrical grid, e.g. a local grid or utility grid.

The DC-link connects the generator-side converter(s) to the grid-side converter(s). In addition, the DC link is used for voltage balancing between the generator-side converter(s) and the grid-side converter(s) by use of capacitors. In some embodiments the DC-link comprises at least two stacked strings, i.e. at least one string with a positive potential and at least one string with a negative potential. In some of these embodiments the DC-link also comprises a center-connection line at substantially zero potential. In some other embodiments one of the at least two strings is at substantially zero potential.

The term "converter" may include a plurality of converter strings, which may either be connected in parallel or in series. The term impedance is to be understood as a generic term for all kinds of resistances, e.g. Ohmic resistance, complex resistance. Determining an impedance is not limited to any sort of unit system, e.g. ohm, volt, ampere, but also covers dimensionless numbers representative of the impedance.

The method provided monitors the converter system by determining an impedance of the DC-link conductor arrangement by means of first and second DC-voltage sensors that measure voltage. Since electrical power in the order of several megawatts, generated by the wind-turbine generator, is routed through the DC-link, the impedance of the DC-link is monitored.

If the impedance of the DC-link conductor arrangement increases, for example, due to shaky connections between the DC-link and one or more converters on either side of the DC-link or due to a fault in the DC-link conductor arrangement, e.g. a copper cable, additional heat is generated at the faulty location. Extensive heat production can damage an insulation of the DC-link and, in extreme cases, might even cause a fire.

The impedance of the DC-link conductor arrangement between the generator-side converter and the grid-side converter is calculated by measuring a transverse voltage, i.e. the voltage between the positive conductor and the negative conductor, at the generator-side converter and by simultaneously measuring the transverse voltage at the grid-side converter. Additionally, a current through the DC-link conductor arrangement is known or measured as well. The DC current flow through the DC-link conductor arrangement might be known, for example, from a matching table, which assigns wind speeds to current flows. Such a matching table is, for example, created in advance. Thus the impedance can be calculated by putting a voltage difference between the obtained voltages in relation to the obtained current, for example, by dividing the voltage difference by the current.

If, for example, the voltage difference increases over time while the current through the DC-link conductor arrangement is constant, this is an indication of an onset of a DC-link fault. As a consequence, the current through the DC-link can be reduced to protect the conductor arrangement. Depending on the severity of the fault, current flow though the DC-link can be reduced partly or completely, i.e. down to zero, for example, by shutting down the wind turbine, until maintenance can be performed. In addition, an alarm can be activated.

To reduce systematical errors of the voltage measurement, a first measurement, i.e. a reference measurement, at close-to-zero current through the DC-link may be performed beforehand. At substantially zero current, the voltage difference between the generator-side measurement and the grid-side measurement should also be substantially zero. Deviations from zero are most likely due to offsets in the voltage sensors, which can be adjusted using offset parameters after this first measurement at close-to-zero current. A second voltage measurement at operational current, i.e. current produced by the generator when the wind turbine operates above cut-in wind speed, can be performed afterwards. The cut-in wind speed, where normal-operation conditions can be achieved, is dependent on the make and model of the wind turbine and may, for example, range from 2 m/s to 5 m/s. In the measurement at operational current through the DC-link conductor arrangement, the voltage difference between the generator-side converter and the grid-side converter can be corrected by the offset parameters obtained during the first measurement.

If the impedance, which may have been corrected in the way described above, exceeds a given threshold indicating that the converter system is operating outside normal-operation parameters, an alarm may be activated and/or the current flow through the converter system may be reduced, for example, by reducing the generator output by pitching the rotor blades, i.e. by turning the rotor blades of the wind-turbine out of the wind.

In some embodiments the known or measured DC current used for determining the voltage difference is produced and supplied by a wind-turbine generator, i.e. a normal-operation-current output of the generator is used. Hence, a voltage measurement is performed without injecting a dedicated monitoring DC current into the split wind-turbine-converter system.

In some embodiments the DC-link comprises at least one two-phase cable, two single phase cables, or at least one bus bar. Since high currents in the order of 1 kA (kiloamps) run through the DC-link conductor arrangement, normal cable wires are not suitable for this application. Hence, cables that are essentially thick copper rods with a diameter of, e.g. ten centimeters, are used instead.

In some embodiments the cables or the bus bar extend from one side of the DC-link to the other side, i.e. the DC-link conductors are directly connected to an output of the generator-side converter and an input of the grid-side converter. In other words, the DC-link conductors are constructed as a single piece.

In some embodiments the DC-link conductor arrangement extends over 50 meters. In some embodiments the DC-link conductor arrangement extends over 75 or even over 100 meters.

In some embodiments the DC current flowing in the DC-link conductor arrangement is measured by a current sensor that measures DC current, for example, in the form of a sensor that measures the magnetic field around a conductor, e.g. using the Hall effect.

In some embodiments the DC-link, e.g. copper rods, is connected to the output of the generator-side converter by one or more pressure or welded joints. In some of these embodiments the DC-link is also connected to the input of the grid-side converter by one or more pressure or welded joints.

In some embodiments two voltage differences at two different DC currents through the DC-link conductor arrangement are determined. A first voltage difference at a first DC current and a second voltage difference at a second DC current are determined independently from each other. First and second DC currents pertain to DC currents of different magnitude, not to a chronological sequence in which the currents are obtained. For example, what is referred to as "the second DC current" may be greater than "the first DC current".

In some embodiments the first voltage difference is determined during a cut-in procedure, i.e. before the wind-turbine generator produces power that is fed into an electrical grid. A DC current flow which is relatively small compared to the operational current is used for determining the first voltage difference. The first voltage difference may be determined at each start-up of the wind turbine, for example, at zero current or close-to-zero current through the DC-link conductor arrangement, for example, by briefly connecting the rotor to the generator and/or by briefly connecting the generator to the generator-side converter before the cut-in wind speed is reached. Here, "briefly" should be understood as the time required to determine the DC voltage at both ends of the DC-link conductor arrangement, i.e. the voltage difference at the current DC current.

In an alternative embodiment the rotor, generator and generator-side converter remain connected during the cut-in procedure and the power produced is dissipated, for example, by a chopper until normal-operation conditions are achieved and the power produced is fed to the electrical grid.

In some embodiments the first voltage difference is determined during shut-down procedures of the wind turbine that are not related to the determination of a voltage difference. Thereby the first voltage difference can be determined at a DC current through the DC-link conductor arrangement that is lower than operational current. This might be done, for example, during low-wind conditions, when the wind turbine cannot operate at a nominal power-production level anyway, or when scheduled or unscheduled maintenance is performed.

In some embodiments an offset-voltage-difference value is determined on the basis of the first voltage difference, when the first, i.e. the lower, DC current is flowing through the DC-link conductor arrangement. In some embodiments the second voltage difference is always determined at operating current.

In some embodiments the offset-voltage-difference value, obtained at substantially zero current, for correcting the voltage difference in the DC-link conductor arrangement at operational current, is applied to the voltage difference before the difference is put in relation to the operational current, e.g. is divided by the operational current. In some other embodiments the offset-voltage-difference value comprises a correction factor representing a zero-current offset, a gain offset, or the like, and is subtracted from the resulting impedance or is multiplied with the resulting impedance, depending on the formulas used in calculating the impedance of the DC-link conductor arrangement.

In the voltage measurements, for example, voltage differences, i.e. cable voltages, in the order of 0-5 V (volts) at current levels of 0-4000 A (amps) are determined. A gain error may comprise two parts: One part is the part of the gain error that can be seen as an offset error at the voltage level used by the converter at a working point of, e.g. approximately 1000 V. This part is eliminated in the measurement scheme of the DC-cable impedance claimed herein. The other part is a small signal gain error, which will still be present in a calibrated measurement, which means that a gain error of 1%, will still be a 1% error in the resulting impedance measurement. However, this is considered to be a small error, and can be neglected. The main contribution to the error is the offset error and the gain-offset error. The gain error in the current measurement will directly impact the total error of the measurement. A 1% gain error here, will give a 1% total error. Again this is a small contribution to the absolute error and can be neglected. A total error within +/−10% is considered to be good enough for most purposes.

In some embodiments the first voltage difference is determined at operating current through the DC-link conductor arrangement, i.e. current produced by the generator when the wind turbine operates above cut-in wind speed. The second voltage difference is determined at a still higher DC current through the DC-link conductor arrangement. The first voltage difference may be determined, for example, when the wind speed drops during normal operation or the second voltage difference may be determined during a gust of wind. The offset-voltage-difference value is then determined on the basis of an extrapolation of the first voltage difference at zero current or close-to-zero current through the DC-link conductor arrangement. The two data points, i.e. the voltage differences at the two different DC currents, are used to extrapolate the voltage difference at zero current or close-to-zero current through the DC-link conductor arrangement. The two different DC currents need to deviate enough for the extrapolation down to zero current or close-to-zero current to be calculated with high enough accuracy, e.g. at least 10%. Thus, the zero-current offset, the gain offset, and the like can be corrected during normal operation without the wind turbine having to be shut down.

In some embodiments the second voltage difference is corrected by the offset-voltage-difference value and the impedance of the DC-link conductor arrangement is determined by putting this corrected voltage difference in relation to the associated DC current, e.g. by dividing the corrected voltage difference by the DC current through the DC-link conductor arrangement. Hence, systematical errors of the voltage measurements can be reduced, as zero-current offsets and the like can be eliminated or mitigated.

In some embodiments the generator-side converter is located on top of a wind-turbine tower inside a nacelle. The wind-turbine generator is also located in the nacelle. Hence, the converter where the three-phase AC current, which is produced by the wind-turbine generator, is converted to DC current is close to the point of creation. Thereby, losses due to the impedance of the conductors connecting the generator to the generator-side converter can be reduced.

In some embodiments the grid-side converter is located at the bottom of the wind turbine tower, for example, inside the tower base. Hence, the extra mass and extra heat generation caused by the grid-side converter is removed from the nacelle. Thereby the size and weight of the nacelle is reduced, which facilitates the setup, i.e. the construction, of the wind turbine.

The DC-link conductor arrangement comprises, for example, copper cables extending from the top of a wind-turbine tower, where a nacelle and the generator-side converter are located, to the base of the wind-turbine tower, where the grid-side converter is located. In some embodiments the DC-link extends inside the wind-turbine tower from the nacelle at the top to the base of the wind-turbine tower. Depending on the tower height, the DC-link may be over 100 meters long.

In some embodiments the generator-side converter is a passive or an active rectifier and the grid-side converter is an inverter. A passive rectifier is voltage controlled, i.e. a passive rectifier has a basic operating principle of a diode. If a high enough voltage level is reached, the rectifier is switched. An active rectifier on the other hand is actively controlled, i.e. a substantially freely and adjustable switching pattern can be chosen. The AC current produced by the wind-turbine generator is transported to a transformer at the base of the wind-turbine tower through the DC-link conductor arrangement, thereby enabling voltage and power regulation using capacitor banks in the DC-link.

In some embodiments the current through the DC-link conductor arrangement is reduced to zero in response to an impedance measurement which exceeds a given threshold. In some embodiments the reduction of current flow through the DC-link is regulated in several stages. At a first stage, where the impedance of the DC-link conductor arrangement exceeds a nominal value only slightly, the current flow is reduced to protect the DC-link conductors. The current flow can be reduced in steps according to a plurality of set points, i.e. impedance thresholds. If a certain threshold is reached, integrity of the entire installation is at risk and an immediate shut down sequence of the wind turbine is initialized. Different alarm levels may also accompany the different fault stages.

The split wind-turbine-converter system disclosed has at least one generator-side converter, at least one grid-side converter, a common DC-link and a controller. The DC-link connects the generator-side converter(s) to the grid-side converter(s). The generator-side converter(s) and the grid-side converter(s) are arranged at distant locations. The DC-link is provided by an elongated conductor arrangement with at least one positive conductor and at least one negative conductor.

The controller is arranged to determine a voltage level between the positive and the negative conductor of the DC-link conductor arrangement at the generator-side converter using a first DC-voltage sensor that measures voltage. The controller is further arranged to determine a voltage level between the positive and the negative conductor of the DC-link conductor arrangement at the grid-side converter using a second DC-voltage sensor that measures voltage.

The controller is arranged to determine a difference between the two voltages on the basis of data provided by the first and second DC-voltage sensor, and is arranged to determine an impedance of the DC-link conductor arrangement by putting the determined voltage difference in relation to a known or measured current flowing through the DC-link conductor arrangement, for example, by dividing the voltage difference by the associated DC current.

The controller is arranged to recognize a fault state in response to the impedance exceeding a given threshold. If a fault state is recognized, the controller may sound an alarm and/or reduce the DC current flowing through the DC-link conductor arrangement.

In some embodiments the split wind-turbine-converter system is further arranged to carry out the method according to any or all of the above-mentioned embodiments.

BRIEF DESCRIPTION OF THE DRAWINGS

Exemplary embodiments of the invention are now described, also with reference to the accompanying drawings, wherein.

The drawings and the description of the drawings are of examples of the invention and are not of the invention itself.

DESCRIPTION OF EMBODIMENTS

Figure 1:
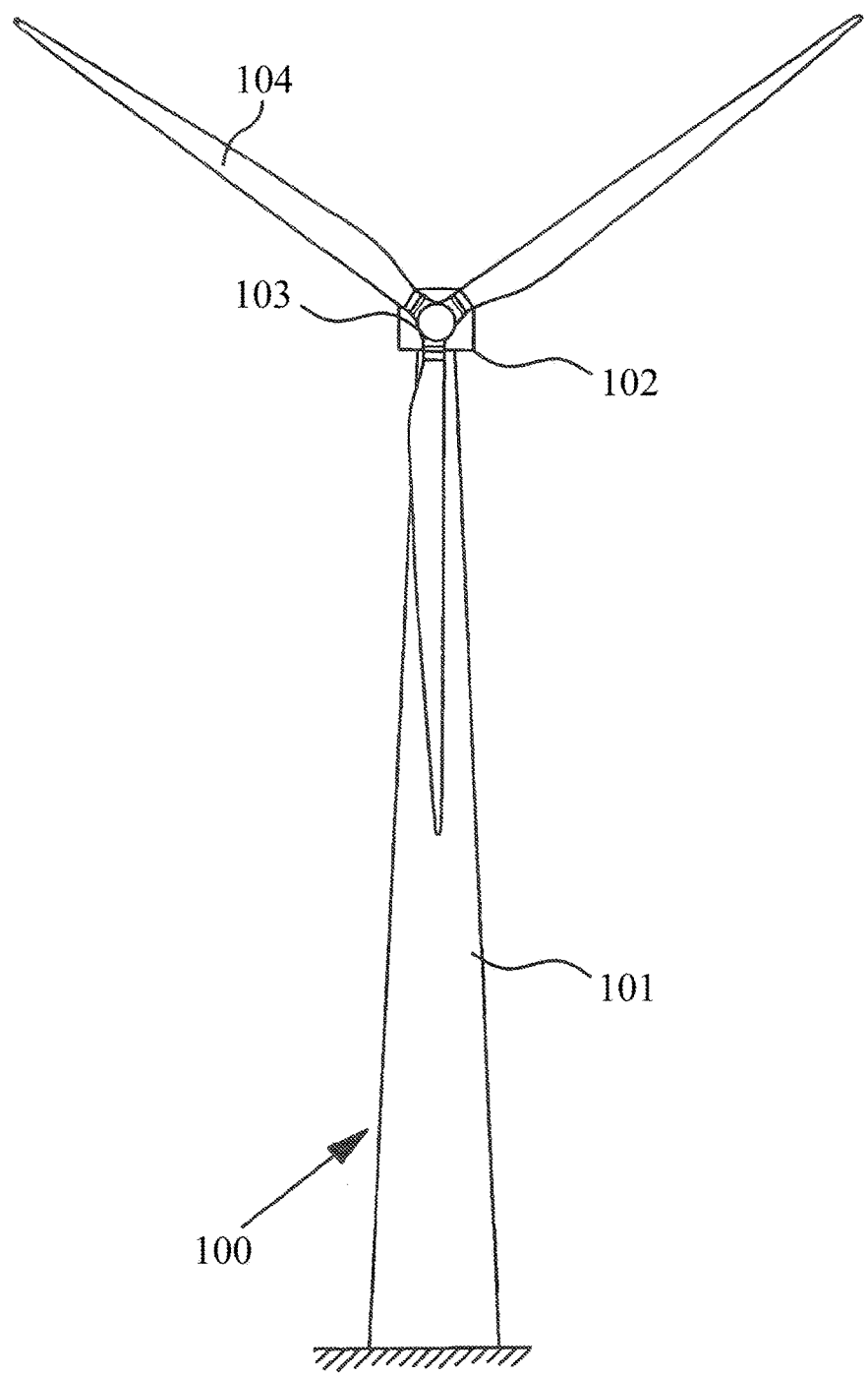
FIG. 1 illustrates a wind turbine equipped with a nacelle mounted on a wind turbine tower, a rotatable hub, and three rotor blades.

An exemplary embodiment of a wind turbine 100 according to FIG. 1 has a wind-turbine tower 101, a nacelle 101 on top of the tower 101, a rotatable hub 103 connected to the nacelle, and three rotor blades 104 connected to the hub 103.

The nacelle 102 is connected to the tower 101 by a yaw bearing allowing the nacelle 102, and thereby the rotor blades 104, to be turned into the wind. The base of the rotor blades 104, connecting the rotor blades 104 to the hub 103, is pitchable, i.e. the rotor blades 104 can be rotated in an axis perpendicular to the main axis through the hub 103 and the wind-turbine generator 110 along a drive shaft 105, shown in FIG. 2. By pitching the rotor blades 104, an angle of attack can be chosen so that a given rotational speed of the hub 103, which is connected to the generator 110, is achieved.

Figure 2:
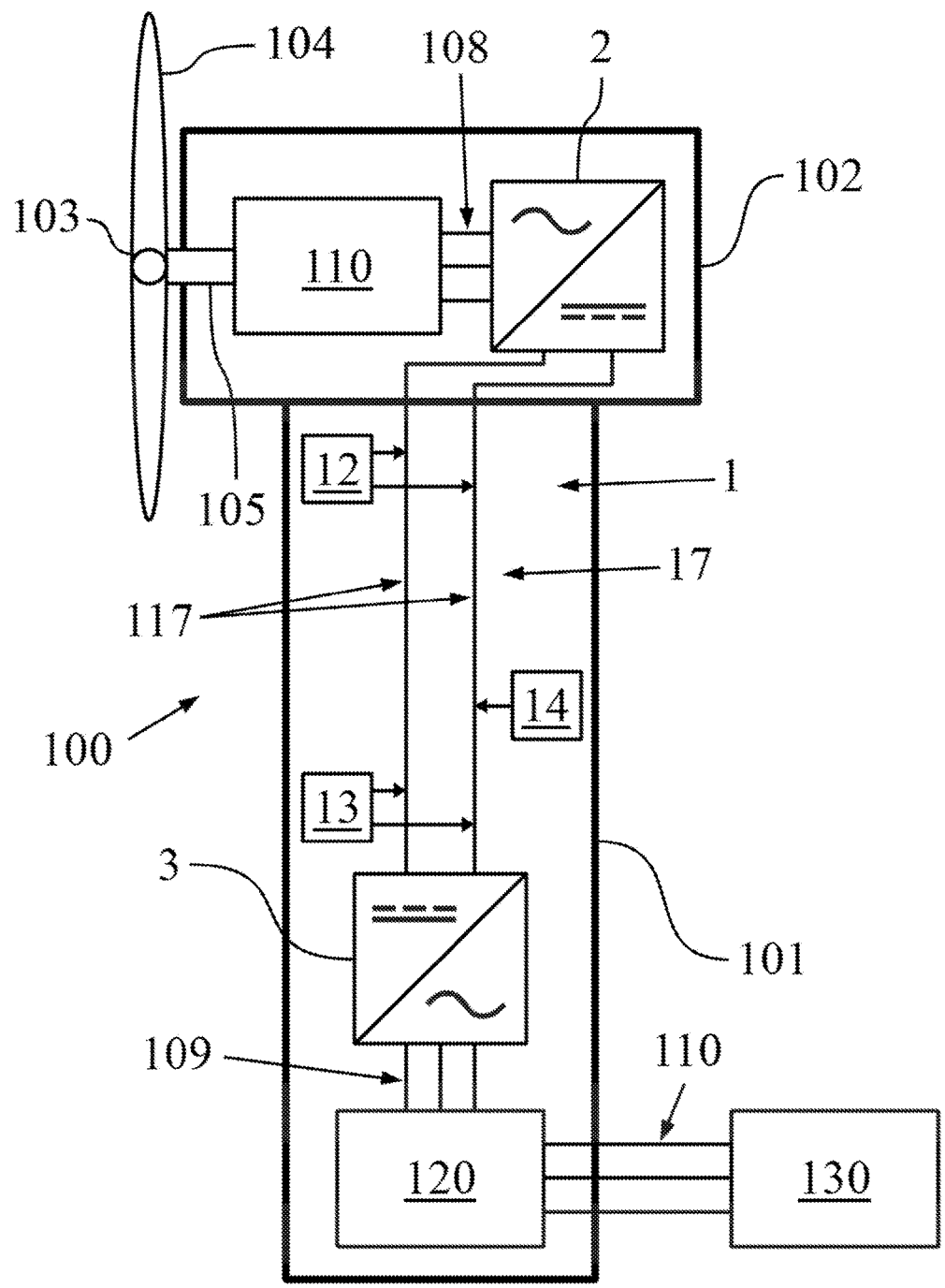
FIG. 2 is another schematic representation of the wind turbine of FIG. 1 equipped with a split converter system including a generator-side converter located in the nacelle and a grid-side converter located at the base of the tower of the wind turbine, FIG. 3 schematically illustrates a control system for impedance determination to be used in the wind turbine of FIGS. 1 and 2, including a current sensor, two voltage sensors, and an alarm to indicate an increased impedance.
Figure 4:
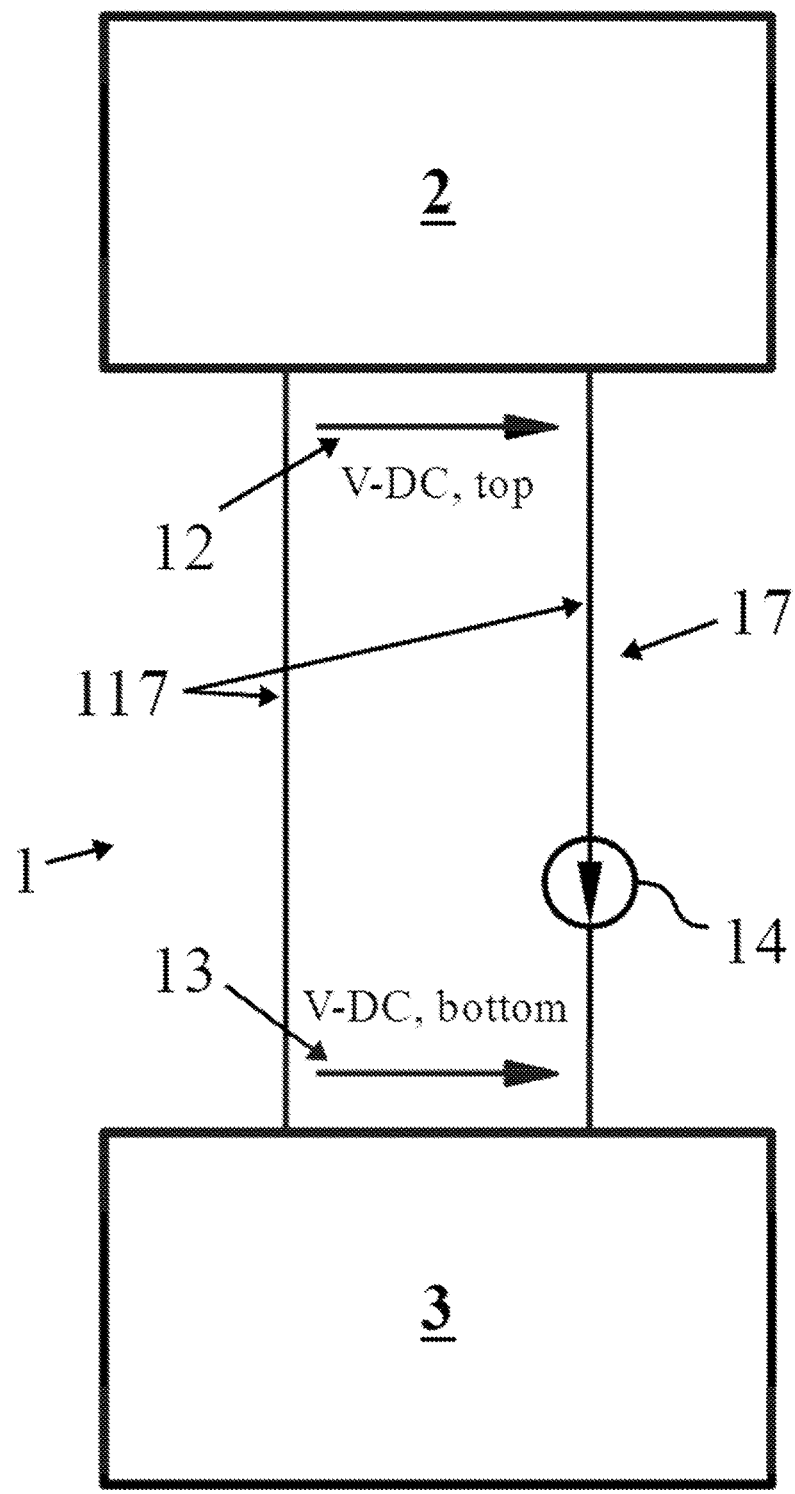
FIG. 4 illustrates the schematic converter system of FIG. 2, wherein the generator-side voltage sensor and the grid-side voltage sensor are represented by arrows between the positive conductor and the negative conductor of the DC-link.
Figure 5:
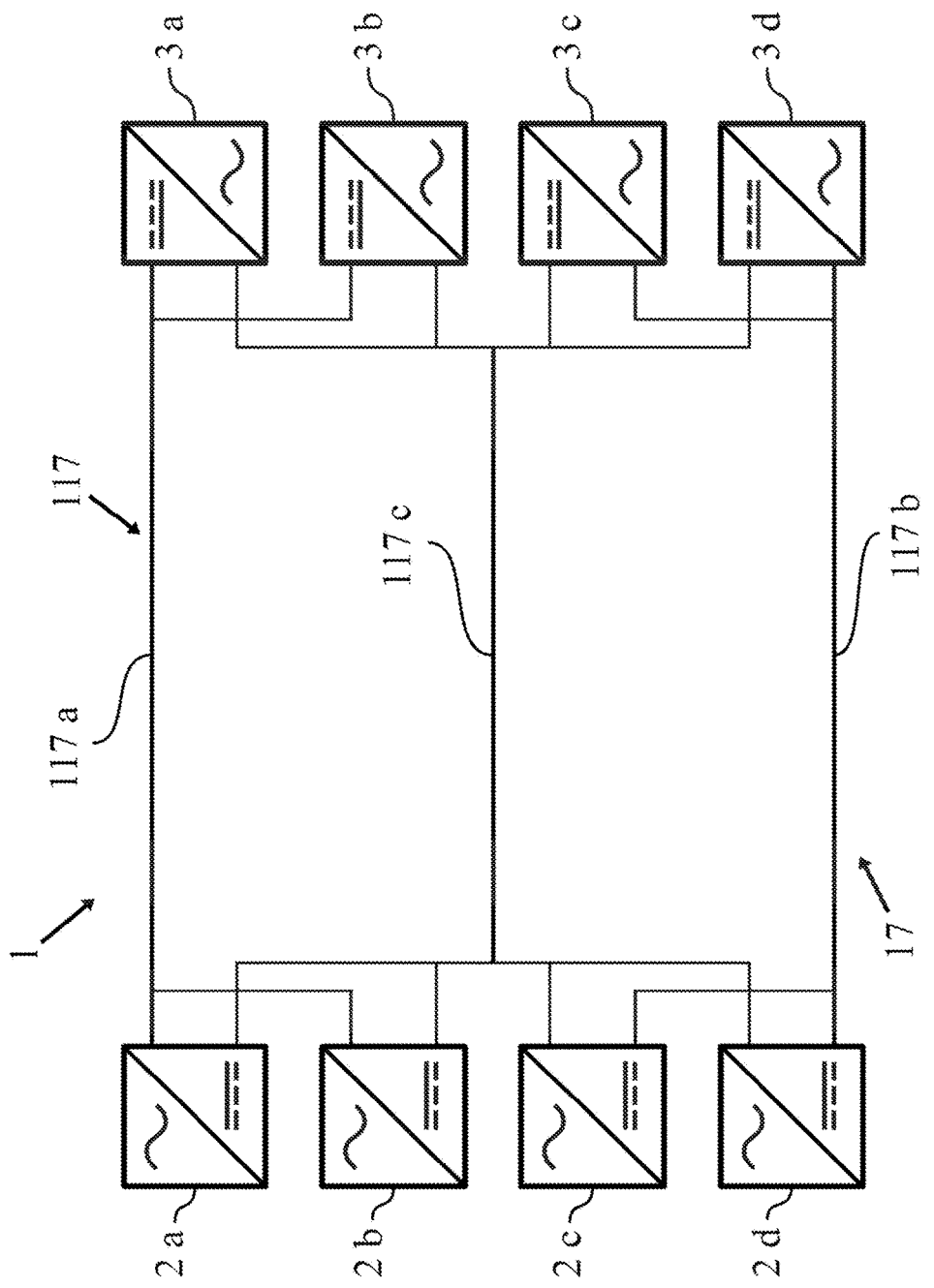
FIG. 5 illustrates a stacked converter topology of the converter system of FIG. 2 and/or FIG. 4, forming a positive string, a negative string, and a common centre connection line.

By pitching the rotor blades 104 to adjust the rotational speed of the generator 110, a given output voltage can be delivered to the generator-side converter 2, shown in FIGS. 2, 4, and 5.

A cross-sectional view of an exemplary wind turbine 100 according to FIG. 2 has a split converter system 1, extending from the nacelle 102 at the top of the tower 101 down to the base of the tower 101, and a connection via a three-phase connection line 160 to an electrical grid 130. Wind causes the rotor blades 104, the rotatable mounted hub 103, and the drive shaft 105 to rotate and thereby produce electric power in the generator 110.

A current output of the generator 110 is fed to generator-side converters 2 via a three-phase connection line 140. The generator-side converters 2, for example, are arranged in a stacked string topology with two parallel generator-side converters 2 in each string, as illustrated in FIG. 5. The generator-side converters 2 deliver at an output DC current which is fed into the DC-link conductor arrangement 117 of the DC-link 17 of the split converter system 1.

A voltage level in the DC-link 17 at the generator-side converters 2 is determined by a voltage sensor 12 performing a transverse voltage measurement between the positive and the negative conductor 117a, 117b of the DC-link conductor arrangement 117. A voltage level in the DC-link 17 at the grid-side converters 3, which, for example, are arranged in a stacked string topology with two parallel grid-side converters 3 in each string, as illustrated in FIG. 5, is determined by a voltage sensor 13 performing a transverse voltage measurement between the positive and the negative conductors 117a, 117b of the DC-link conductor arrangement 117. A measurement of the current through the DC-link conductor arrangement 117 is performed by a DC-current sensor 14.

The output of the DC-link conductor arrangement 117 is fed into the grid-side converters 3, which deliver a three-phase AC current at the output-side. The three-phase AC current outputted by grid-side converters 3 is fed to a transformer arrangement 120 via a three-phase connection line 150. The transformer arrangement 120 raises the voltage to grid level and feeds the high voltage AC current via a three-phase connection line 160 to the electrical grid 130. The transformer arrangement 120, for example, comprises two transformers in star-configuration on the low-voltage side and a third transformer in delta-configuration on the high-voltage side.

Figure 3:
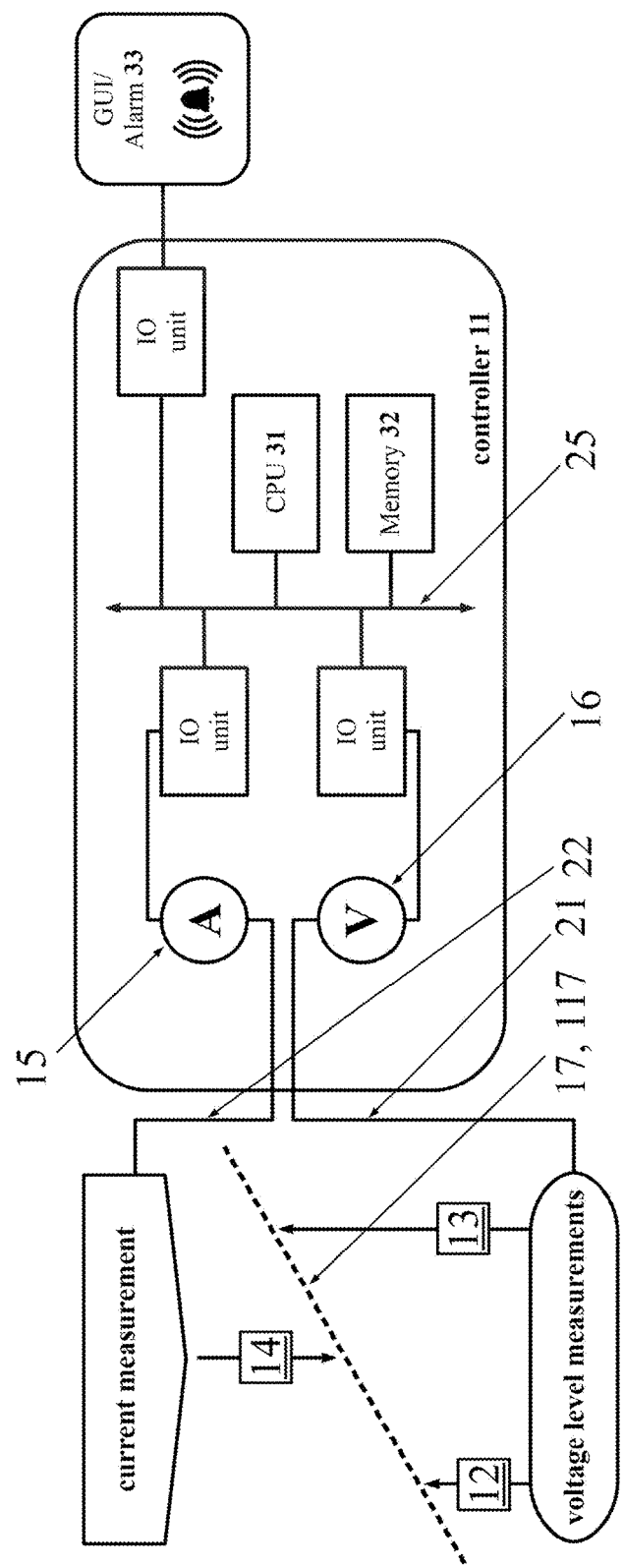

An exemplary controller 11 according to FIG. 3 performs the impedance monitoring of the DC-link 17. The controller 11 comprises an ammeter 15 for measuring, with the current sensor 14, the DC current through the DC-link 17, or rather through the DC-link conductor arrangement 117. The controller 11 further comprises a voltmeter 16 for measuring the DC voltage level at either end of the DC-link 17 at the two voltage sensors 12 and 13. Alternatively, each voltage sensor 12, 13 may be connected to a dedicated voltmeter 16.

The controller 11 is connected with the current sensor 14 by cable 22. In some examples of the controller 11, the ammeter 15 may be part of the current sensor 14. The controller 11 is connected with the voltage sensors 12, 13 by cable 21. In some examples of the controller 11, a voltmeter 16 may be part of the voltage sensors 12, 13.

The controller 11 also comprises a CPU 31 and a memory 32 for calculating and storing the impedance of the DC-link conductor arrangement 117 based on the received current and voltage data. The impedance Z of the conductor 117a, 117b in the DC-link 17 is calculated according to $$Z_{cable} = \frac{V_{cable}}{I_{cable}} = \frac{V_{DC,top} - V_{DC,bottom}}{I_{cable}}$$

where $V_{DC, top}$ is the output value of the voltage sensor 12, $V_{DC, bottom}$ is the output value of the voltage sensor 13, and $I_{cable}$ is the output value of the current sensor 14. The obtained impedance values are stored in the memory 32 for future reference. If an impedance at a later measurement has a significantly higher value than the stored impedance values, the controller 11, for example, either notifies a control center by an alarm 33 or reduces the current flow through the DC-link conductor arrangement 117 autonomously.

To improve the accuracy of the impedance measurement, the voltage sensors 12, 13 are calibrated, for example, once per month. For the calibration a voltage difference, denoted $V_{error}$, at substantially zero current through the DC-link 17 is measured according to $$V_{error} = V_{DC,top} - V_{DC,bottom}, I_{cable} \approx 0$$

where $V_{DC, top}$ is the output value of the voltage sensor 12, and $V_{DC, bottom}$ is the output value of the voltage sensor 13, as before. Optimally $V_{error}$ is zero, since substantially no voltage drop occurs at substantially zero current through the impedance of the conductor of the DC-link 17. However, the two voltage sensors 12, 13 are not identical and exhibit manufacturing tolerances and the like, leading to an offset between the two voltage sensors 12 and 13.

The voltage difference at either end of the DC-link 17, determined by the respective voltage sensors 12 and 13, is corrected by the above-determined deviation $\backslash T_{error}$ according to $$Z_{cable} = \frac{V_{DC,top} - V_{DC,bottom} - V_{error}}{I_{cable}}, I_{cable} \approx \text{operational current}$$

where $V_{DC, top}$ is the output value of the voltage sensor 12, $V_{DC, bottom}$ is the output value of the voltage sensor 13, $V_{error}$ is the offset of the voltage sensors 12 and 13, i.e. the deviation between $V_{DC, top}$ and $V_{DC, bottom}$ at substantially zero current through the DC-link 17, and $I_{cable}$ is the output value of the current sensor 14.

A data bus 25 connects the ammeter 15, voltmeter 16, CPU 31, memory 32, and the alarm 33 through several input/output (JO) units.

An exemplary DC-link impedance measurement setup according to FIG. 2, is shown in FIG. 4 in more detail. The split converter system 1 comprises a set of generator-side converters 2, i.e. a set of rectifiers, for converting the AC current, produced by the wind-turbine generator 110, to DC current that is to be fed to the DC-link 17. The set of generator-side converters 2, for example, comprises two stacked strings with two parallel converters each.

The split converter system 1 also comprises a set of grid-side converters 3, i.e. a set of inverters, for converting the DC current, output by the DC-link 17, to AC current that is to be fed to a set of transformers 120. The set of grid-side converters 3, for example, comprises two stacked strings with two parallel converters each.

The set of generator-side converters 2 and the set of grid-side converters 3 is connected by a common DC-link 17, i.e. all converters 2, 3 are connected to the same DC-link conductor arrangement 117; there are no parallel DC-links for the individual converters 2, 3.

A first transverse-voltage level between the positive conductor 117a and the negative conductor 117b of the DC-link 17 is measured by voltage sensor 12. A second transverse-voltage level between the positive conductor 117a and the negative conductor 117b of the DC-link 17 is measured by voltage sensor 13. The voltage sensor 12 is associated with the generator-side converters 2 and the voltage sensor 13 is associated with the grid-side converters 3. The current through the DC-link conductor arrangement 117 is measured by current sensor 14. This current is produced by the wind-turbine generator 110 and constitutes the normal output current of the generator 110, which is used for the voltage measurements without a dedicated monitoring DC current injected into the DC-link conductor arrangement 117.

In the event of a faulty conductor 117a, 117b, a shaky connection, or the like in the DC-link 17, an increased voltage drop is registered by voltage sensor 13. Thereby, a deviation is detected in the voltage difference between the two voltage sensors 12 and 13, compared to normal operation. The voltage difference at nominal current through the DC-link 17 is known. If a deviation from this voltage difference at nominal current is observed, this gives an indication of a fault in the DC-link 17. The current through the DC-link is reduced according to the size of the deviation in order to protect the DC-link from localized heat generation, which might cause secondary faults, e.g. short circuits at the converters 2 and 3 due to melted insulators. This also holds true for operational currents below the nominal current.

In another exemplary embodiment a wind turbine with a segmented power train is provided. Additional AC-voltage sensors are located at the output of the wind-turbine generator 110 and at the output of the grid-side converters 3. Hence, by gathering voltage data from the distributed voltage sensors, the wind-turbine power train can be divided into five segments, namely generator segment, generator-side-converter segment, DC-link segment, grid-side-converter segment, and grid segment. Depending on the voltage readings of the four voltage sensors, a general area, where a fault in the wind-turbine power train is located, can be identified. This simplifies maintenance of the wind turbine 100, as faulty sections, e.g. a broken generator 110, can be determined by comparing the current voltage data for all the sections with reference data of operational voltage during normal operation stored in a memory 32.

An exemplary split converter system 1 with an extended DC-link 17 and with stacked converter strings is illustrated in FIG. 5. Generator-side converters 2a and 2b and grid-side converters 3a and 3b form a first converter string, whereas generator-side converters 2c and 2d and grid-side converters 3c and 3d form a second converter string. Generator-side converters 2a and 2b are connected in parallel, as are generator-side converters 2c and 2d. The two strings are connected in series. The grid-side converters 3a-3d are arranged in an analogous manner.

The DC-link 17 comprises a positive conductor line 117a, which is connected to the first string, a negative conductor line 117b, which is connected to the second string, and a center line 117c, which is at substantially zero potential and, for example, is connected to ground by a capacitor. This capacitor allows unwanted AC-current components, e.g. produced by high frequency gating in the converters, to be discharged.

Figure 6:
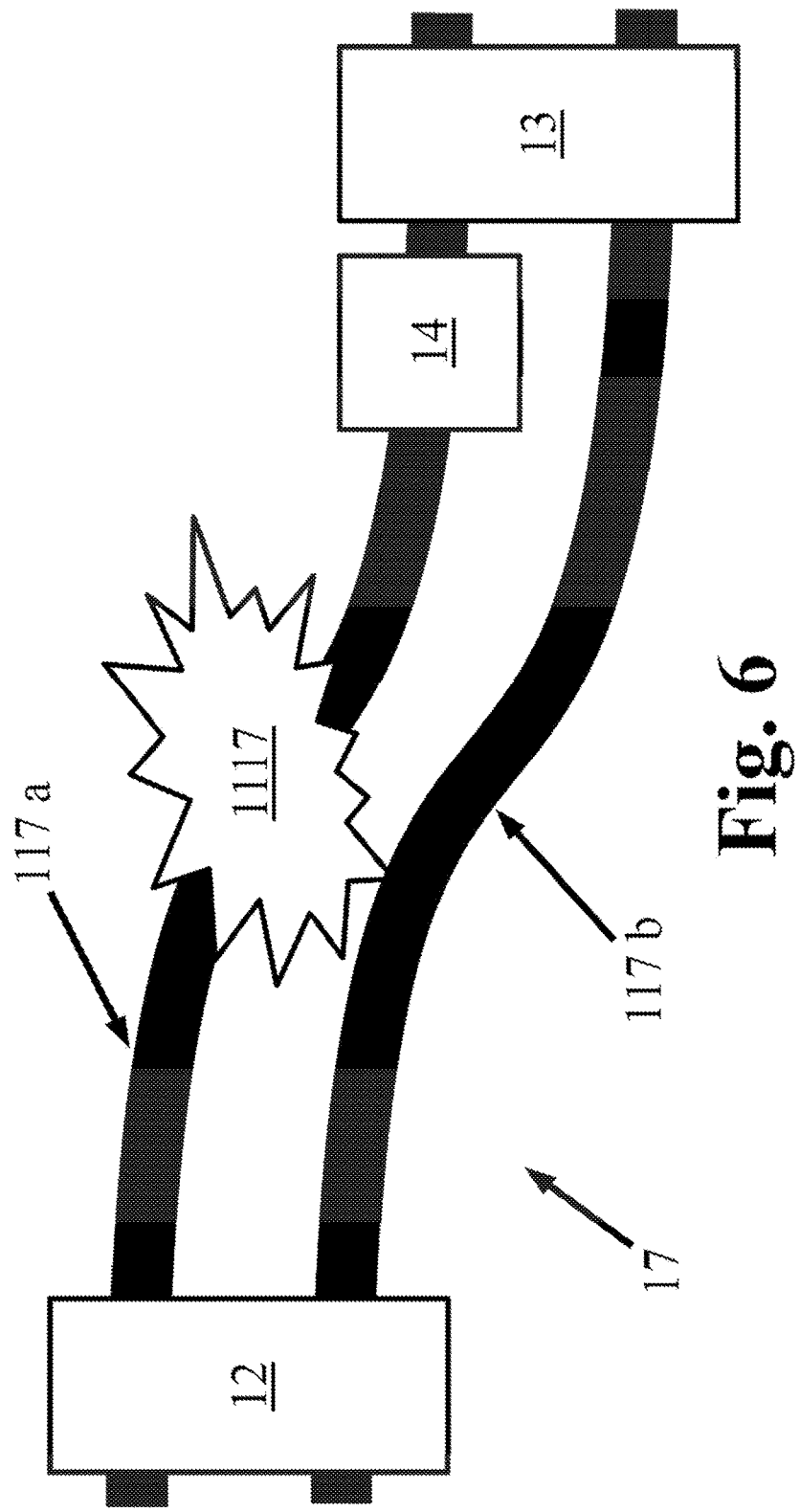
FIG. 6 illustrates a fault in the DC-link of the converter system of FIG. 2 and/or FIG. 4.

An exemplary DC-link 17 with a fault 1117 in one of the conductor lines is illustrated in FIG. 6. In the example of the DC-link 17 depicted, the positive conductor line 117a is the faulty conductor line. While the voltage sensor 12 measures substantially the same voltage level in the DC-link 17, voltage sensor 13 measures only a fraction of the operational voltage level, corresponding to a no-fault situation. This drop in voltage at the grid-side converter's voltage sensor 13 stems from the voltage drop at the increased impedance localized around the fault 1117.

The current through the DC-link conductor arrangement 117 is measured by the current sensor 14. As the conductor lines 117a and 117b are essentially connected in series, a single current sensor 14 is sufficient. The current through the DC-link 17 stays substantially the same, as long as the conductor lines 117a and 117b are not broken. However, increasing heat dissipation, i.e. energy dissipation, occurs in the faulty conductor line 117a, as the severity of the fault, increases.

In order to protect the DC-link 17 and, in extension, the entire wind turbine 100 from extensive heat production, which might lead to secondary faults and damage, e.g. a turbine fire, the current through the DC-link conductor arrangement 117 is reduced in accordance with the increase in impedance measured. In the event of a severe fault 117, the wind turbine is shut down for maintenance.

Figure 7A:
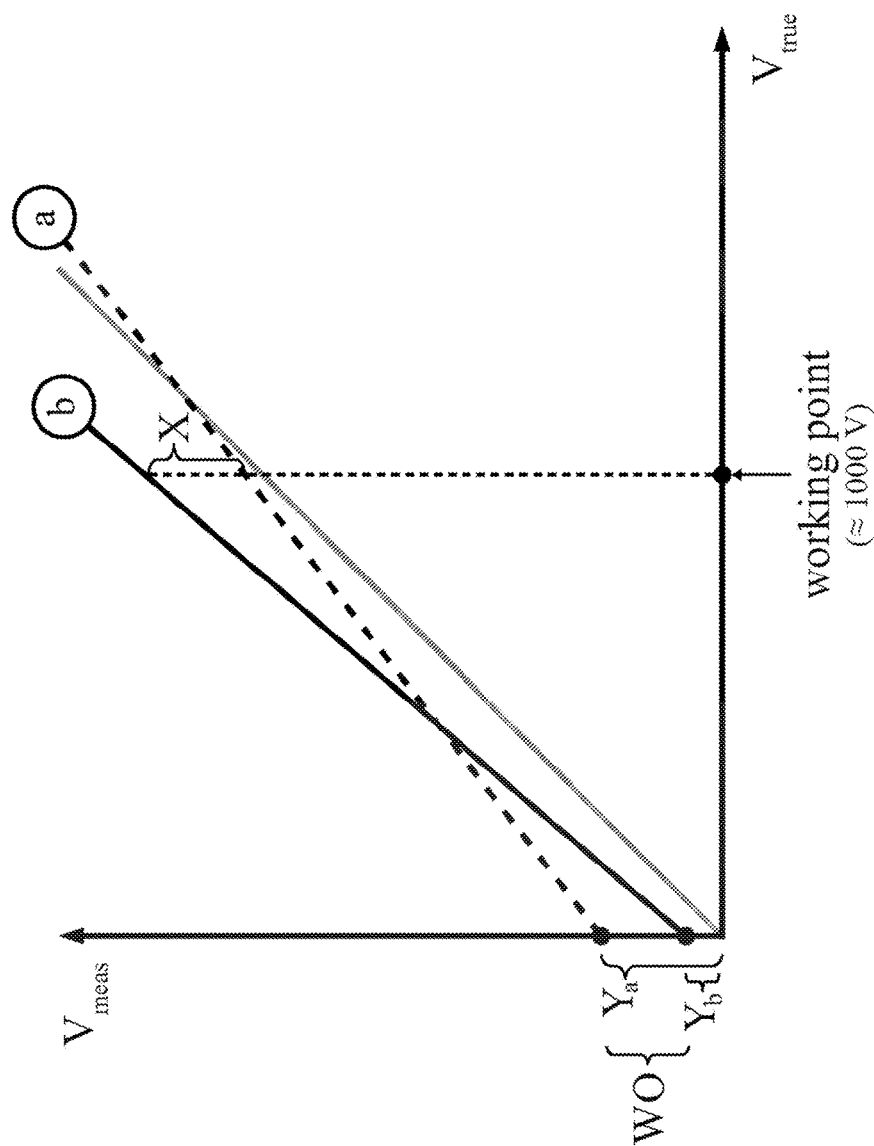
FIG. 7 illustrates an exemplary calibration method of voltage sensors for an impedance measurement of the DC-link according to the monitoring system described herein.
Figure 7B:
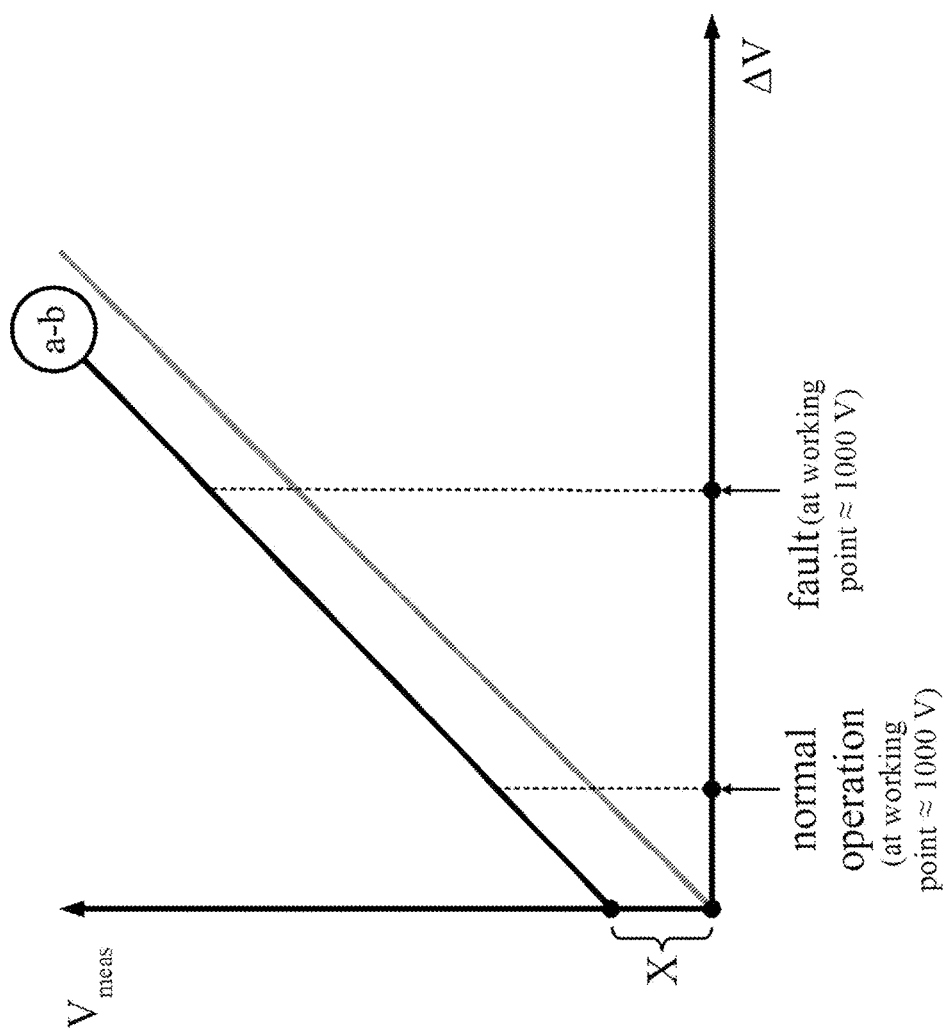
Figure 7C:
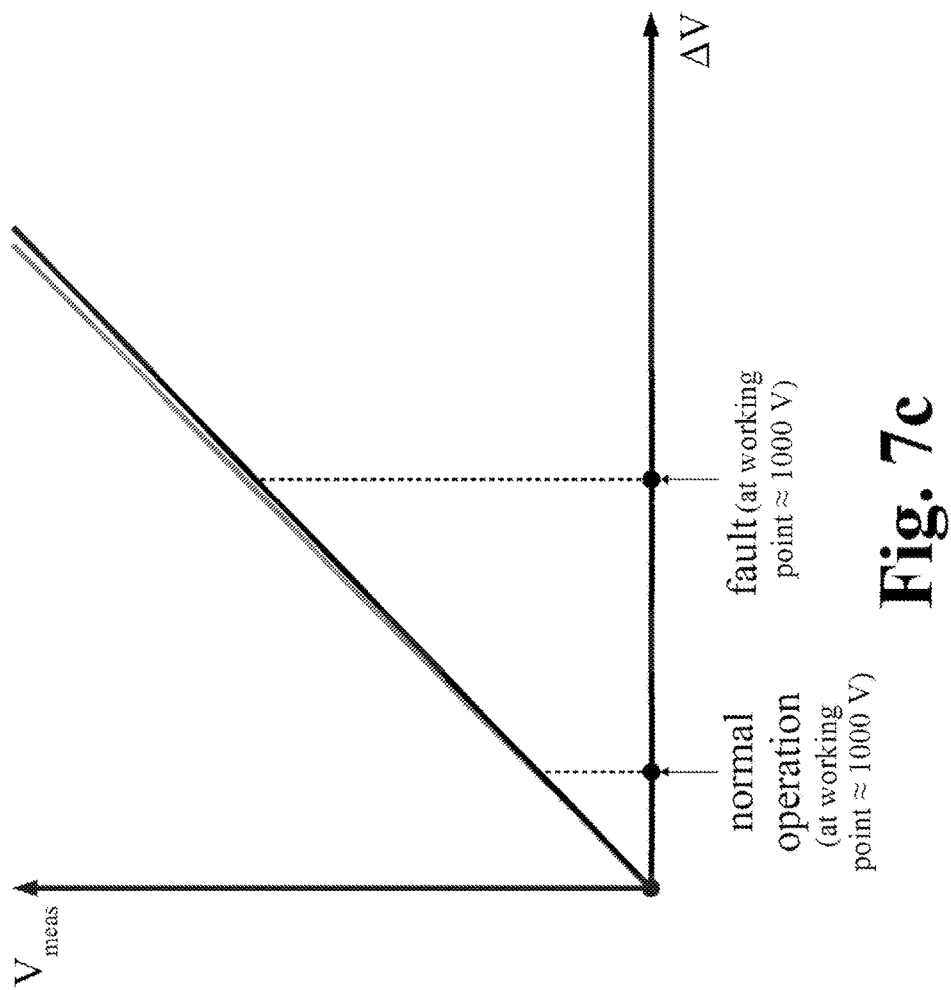

An exemplary calibration of the voltage sensors 12 and 13 according to the FIGS. 7a to 7c reduces measurement errors due to offsets and parts of gain errors, which can be seen as an offset error at the voltage level. In FIG. 7a a measured voltage level $V_{meas}$ is plotted against an actual voltage level $V_{true}$. Calibration functions of both voltage sensors 12, 13 are shown in that plot. The dashed line "a" is, for example, the calibration function of the generator-side voltage sensor 12 and the solid line "b" is, for example, the calibration function of the grid-side voltage sensor 13. The dotted line represents the bisector between the two axes with a slope equal to one, which would be the optimal voltage-sensor response without any error or bias. In this example a working point at about 1000 volts is assumed.

A y-intercept point of $Y_a$ for the characteristic curve "a" and a y-intercept point of $Y_b$ for the characteristic curve "b" are assumed in this exemplary calibration of the voltage sensors 12 and 13. The difference in y-intercept points between the two curves is denoted as WO. The actual difference X between the two curves at the working point is calculated by $X=WO+\Delta g \cdot V_{working\ point}$, where $\Delta g$ is the difference between the two slopes, i.e. the respective gains $g_a$ and $g_b$ of the two voltage sensors 12 and 13, and $V_{working\ point}$ is the voltage at the current working point.

FIG. 7b shows the characteristic curve of the difference of the two voltage-sensor-responses "a-b". The voltage-level difference between the generator-side voltage sensor 12 and the grid-side voltage sensor 13 is plotted on the horizontal axis against the measured voltage $V_{meas}$ on the vertical axis. Here the y-intercept point of "a-b" is the difference X between the two response curves at the working point.

As the DC-link 17 always has a non-zero impedance, also during normal operation and nominal power production of the generator 110, a voltage difference between the generator-side voltage sensor 12 and the grid-side voltage sensor 13 is present at all times. This holds true, as long as there is a current flow through the conductor lines 117a and 117b of the DC-link 17. At substantially zero current, there is also substantially no voltage drop along the DC-link conductor arrangement 117; in that case any measured voltage differences between the two voltage sensors 12 and 13 are caused by offsets, i.e. an offset-voltage-difference value.

As described above in conjunction with FIG. 7a, the y-intercept point X comprises both the constant difference in y-intercept points of "a" and "b", i.e. the zero-current offsets of the voltage sensors 12 and 13, and a second term dependent on the slope difference and the current working point. Therefore, the known difference WO can be subtracted and the resulting curve is illustrated in FIG. 7c.

With this approach there remains only a small error that is dependent on the difference in slope, i.e. on the different gains of the voltage sensors 12 and 13, and the current voltage level, i.e. the working point. This gain error is typically in the range of a few percent, which this is a small contribution to the absolute error and can be ignored.

As can be seen in FIGS. 7b and 7c, the voltage difference between the two voltage sensors 12 and 13 on respective ends of the DC-link 17 increases considerably, if a fault 1117, as shown in FIG. 6, occurs along the DC-link conductor arrangement 117. Depending on the nature of the fault, e.g. a loose connection, a reduced diameter of a conductor line 117a, 117b, or a worn insulator, a slow build-up of impedance accompanied by a rather slow increase in voltage difference can be observed. Alternatively, a rapid or instantaneous impedance increase can be observed, for example, in the event of a broken conductor line 117a, 117b. Depending on the build-up time of the impedance increase, which is an indicator of the nature of the fault 1117, the current flow through the DC-link conductor arrangement 117 might be reduced accordingly or an immediate shut-down command for the wind turbine 100 is issued.

Figure 8:
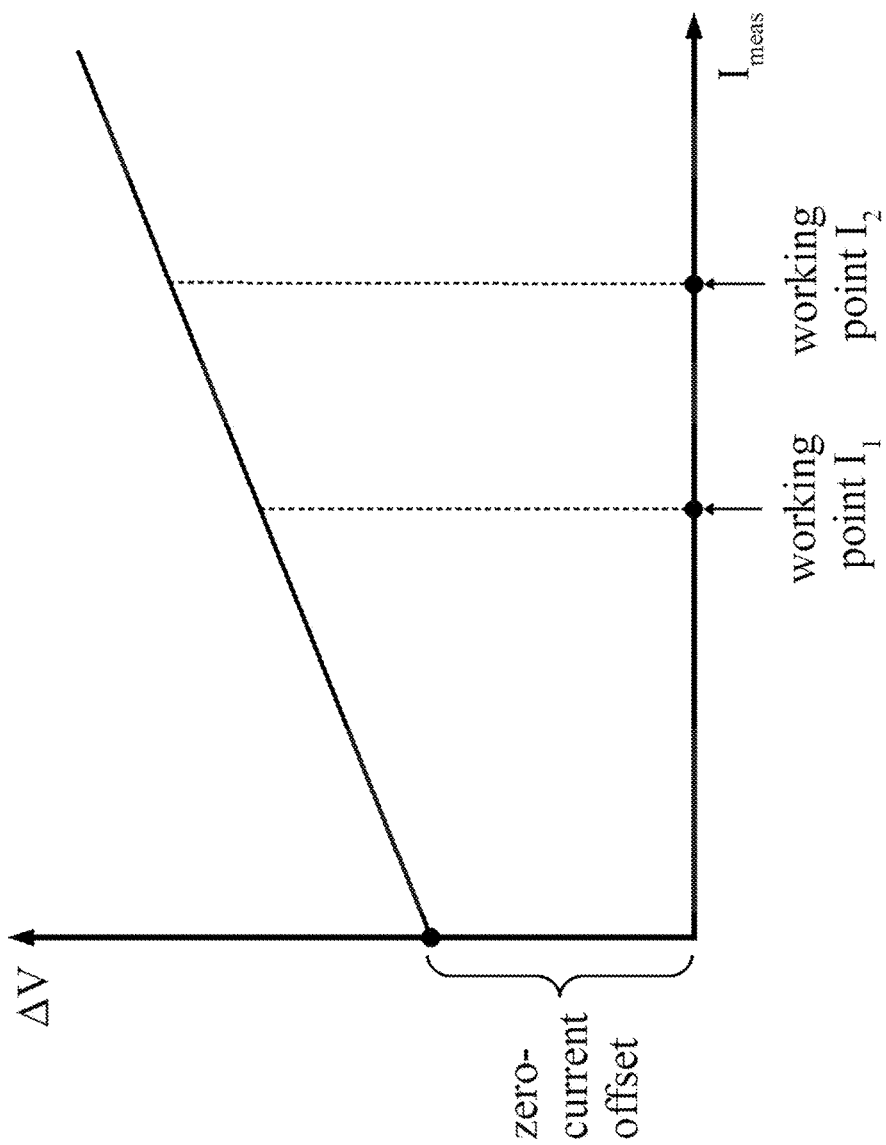
FIG. 8 illustrates another exemplary calibration method of voltage sensors for an impedance measurement of the DC-link involving an extrapolation of data points.

Another exemplary calibration of the voltage sensors 12 and 13, to reduce measurement errors due to offsets and parts of gain errors, which can be seen as offset error at the voltage level, is illustrated in the FIG. 8.

The measured voltage $V_{meas}$ is plotted against the measured current $I_{meas}$. In this exemplary calibration of the voltage sensors 12 and 13, a voltage difference is measured at two different working points with corresponding currents $I_1$ and $I_2$. At working point $I_1$ a DC current flows through the DC-link conductor arrangement 117 that is smaller than the DC current through the DC-link conductor arrangement 117 when the wind turbine 100 is operated at working point $I_2$.

Working point $I_1$ may be reached, for example, during a period of calm or working point $I_1$ could have been the previous working point at normal operation, i.e. an optimal working point, e.g. at a generally lower wind speed. Alternatively, working point $I_2$ may be reached during a brief gust of wind, while working point $I_1$ is the optimal working point for the current conditions, e.g. at a given wind speed and certain grid conditions.

Two individual voltage differences are calculated at the two working points. Based on those data points, an extrapolation down to zero current is performed. The two working points have to be spaced far enough apart, or more precisely, the two DC currents must differ enough, so that the slope of the assumed linear relation between the current through the DC-link 17 and the measured voltage difference between the voltage sensors 12 and 13 can be ascertained with sufficient accuracy. A difference between the working point currents of, for example 10%, will yield sufficient accuracy.

Hence, a zero-current-offset value, i.e. the offset-voltage-difference value at zero current, can be extrapolated from the data at the two individual working points. This extrapolated offset value can be used to reduce the systematic errors of the impedance measurement of the DC-link 17 without the need to shut down the wind turbine 100 for a calibration of the voltage sensors 12 and 13. Thereby, a method for monitoring the impedance of a DC-link 17 is proposed, which both reduces the number of shutdowns of the wind turbine 100, which wear out the wind-turbine components, and conforms to the grid code and also saves money, as the wind turbine 100 does not have to be taken offline. The calibration procedure can be performed during normal operation at operational currents.

Although certain methods and products constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

The invention claimed is:

1. A method of monitoring a split wind-turbine-converter system, wherein the split converter system comprises at least one generator-side converter, at least one grid-side converter, and a DC-link connecting the at least one generator-side converter to the at least one grid-side converter, wherein the at least one generator-side converter and the at least one grid-side converter are arranged at distant locations, wherein the DC-link is provided by an elongated conductor arrangement comprising at least one positive conductor and at least one negative conductor, the method comprises:
   determining, with a first DC-voltage sensor, a first voltage between the positive and the negative conductor of the DC-link conductor arrangement at the generator-side converter;
   determining, with a second DC-voltage sensor, a second voltage between the positive and the negative conductor of the DC-link conductor arrangement at the grid-side converter;
   determining a voltage difference between the first and second voltages;
   determining an impedance of the DC-link conductor arrangement by comparing the determined voltage difference to a DC current flowing through the DC-link conductor arrangement; and
   recognizing a fault state in response to the impedance exceeding a given impedance threshold.

2. The method of claim 1, wherein the DC current used for determining the voltage difference is produced by a wind-turbine generator.

3. The method of claim 1, wherein the DC-link conductor arrangement extends over 50 m, or 75 m, or 100 m.

4. The method of claim 1, wherein the DC current flowing through the DC-link conductor arrangement is measured by a current sensor that measures current.

5. The method of claim 1, wherein the method comprises determining a first voltage difference at a first DC current through the DC-link conductor arrangement and determining a second voltage difference at a second DC current through the DC-link conductor arrangement, wherein the second DC current is higher than the first DC current.

6. The method of claim 5, wherein the first voltage difference is determined during a cut-in procedure before the wind-turbine generator produces power that is fed to an electrical grid.

7. The method of claim 5, wherein the first voltage difference is determined at zero current or close-to-zero current through the DC-link conductor arrangement.

8. The method of claim 6, wherein an offset-voltage-difference value is determined based on the first voltage difference at the first DC current through the DC-link conductor arrangement.

9. The method of claim 5, wherein the first voltage difference is determined at an operating current produced by the generator when the wind turbine operates above cut-in wind speed, through the DC-link conductor arrangement and an offset-voltage-difference value is determined based on of an extrapolation of the first voltage difference at zero current or close-to-zero current through the DC-link conductor arrangement.

10. The method of claim 5, wherein the second voltage difference is determined based on current produced by the generator when the wind turbine operates above cut-in wind speed, through the DC-link conductor arrangement.

11. The method of claim 10, wherein the second voltage difference is corrected by an offset-voltage-difference value, and determining the impedance comprises comparing the corrected voltage difference to the operating current.

12. The method of claim 1, wherein the at least one generator-side converter is a passive or an active rectifier and the at least one grid-side converter is an inverter.

13. The method of claim 1, wherein the generator-side converter is located on top of a wind turbine tower and the grid-side converter is located at the bottom of the wind turbine tower and the elongated DC-link conductor arrangement extends along the wind turbine tower.

14. The method of claim 1, wherein recognizing a fault state comprises one of the following:
   sounding an alarm,
   reducing the current through the DC-link conductor arrangement, and
   shutting down the wind turbine.

15. A split wind-turbine-converter system comprising at least one generator-side converter, at least one grid-side converter, a DC-link connecting the at least one generator-side converter to the at least one grid-side converter, and a controller, wherein the at least one generator-side converter and the at least one grid-side converter are arranged at distant locations, wherein the DC-link is provided by an elongated conductor arrangement comprising at least one positive conductor and at least one negative conductor, the controller being arranged to:
   determine, with a first DC-voltage sensor that measures voltage, a first voltage between the positive and the negative conductor of the DC-link conductor arrangement at the generator-side converter;
   determine, with a second DC-voltage sensor that measures voltage, a second voltage between the positive and the negative conductor of the DC-link conductor arrangement at the grid-side converter;
   determine a voltage difference between the first and second voltages;
   determine an impedance of the DC-link conductor arrangement by comparing the determined voltage difference to a current flowing through the DC-link conductor arrangement; and recognize a fault state in response to the impedance exceeding a given impedance threshold.

* * * * *